United States Patent [19]
Won

[11] Patent Number: 5,777,939
[45] Date of Patent: Jul. 7, 1998

[54] BIT LINE SENSE AMPLIFIER DRIVING CIRCUIT OF A SEMICONDUCTOR MEMORY DEVICE

[75] Inventor: Jang Kyu Won, Ichon, Rep. of Korea

[73] Assignee: Hyundai Electronics Industries Co. Ltd., Kyoungki-do, Rep. of Korea

[21] Appl. No.: 789,106

[22] Filed: Dec. 27, 1996

[30] Foreign Application Priority Data

Dec. 29, 1995 [KR] Rep. of Korea ............... 1995-66019

[51] Int. Cl.$^6$ ................................................ G11C 7/00
[52] U.S. Cl. .................................. 365/222; 365/189.09
[58] Field of Search ........................ 365/222, 203, 365/189.11, 189.09, 230.06

[56] References Cited

U.S. PATENT DOCUMENTS 4,677,592  6/1987  Sakurai et al. ................ 365/222
5,296,801  3/1994  Ohtsuka et al. ................ 323/313
5,317,538  5/1994  Eaton, Jr. ...................... 365/189.09
5,379,400  1/1995  Barakat et al. ................ 395/433
5,594,695  1/1997  Yim et al. ..................... 365/205
5,633,831  5/1997  Tsukude et al. ................ 365/222

Primary Examiner—David C. Nelms
Assistant Examiner—Hoai V. Ho
Attorney, Agent, or Firm—Gary M Nath; Nath & Associates

[57] ABSTRACT

A bit line sense amplifier driving circuit of a semiconductor memory device which has first and second refresh cycle functions includes a bit line sense amplifier driver unit for supplying a pull-up bias potential signal and a pull-down bias potential signal to a bit line sense amplifier; a bit line sense amplifier predriver unit for controlling the current flowing to the bit line sense amplifier driver unit; and a bit line sense amplifier predriver control unit for controlling the bit line sense amplifier predriver unit according to the first and second refresh cycle functions.

10 Claims, 4 Drawing Sheets

5,777,939

BIT LINE SENSE AMPLIFIER DRIVING CIRCUIT OF A SEMICONDUCTOR MEMORY DEVICE

BACKGROUND OF THE INVENTION

1. Field of the Invention

The present invention relates to a bit line sense amplifier driving circuit, and more particularly to a bit line sense amplifier driving circuit which can reduce the noise due to the sensing peak current and enhance the operating speed thereof by varying the data sensing speed of the bit line sense amplifier in the case of different refresh cycles.

2. Description of the Prior Art

Typically, the number of the word lines driven by different refresh cycles on an identical chip is different. For example, in the case of 16M DRAM in which one column is composed of 1024 bit lines, the chip which performs a 4K cycle of refresh drives four word lines per one cycle, while the chip which performs a 1K cycle of refresh drives sixteen word lines per one cycle. Since the number of the cells connected to one word line is 1024, at the 4K refresh cycle, 4K cycle×4K cells=16M bits of cells. Thus, it is possible to refresh all of the 16M bits of cells after the 4K cycle. At the 1K refresh cycle, 1K cycle×16K cells=16M bits of cells. Thus, it is possible to refresh all of 16M bits of cells after the 1K cycle. The number of the word lines driven when performing 1K cycle of refresh is four times the number of the word lines driven when performing 4K cycle of refresh. Also, the current consumed when performing 1K cycle of refresh is four times the current consumed when performing 4K cycle of refresh.

When performing a refresh operation, the bit line sense amplifier BL S/A connected to the cell which is connected to the word line of logic "high" state is driven. The data on the cell is transferred to the bit line if the word line goes to the logic "high" state. At this time, the bit line sense amplifier operates to amplify the data. Thereafter, the amplified data is restored to the cell via the open word line. Thus, the difference of the current consumption at the 1K refresh cycle and the 4K refresh cycle is caused by the driving of the bit line sense amplifier BL S/A.

In a DRAM which has both 1K refresh cycle and 4K refresh cycle, the current flowing by the bit line sense amplifier during 1K refresh cycle is four times as much as that flowing during 4K refresh cycle. The possibility of noise due to the peak current at the 1K refresh cycle is greater than that at the 4K refresh cycle. When testing the characteristic of the chip that operates by a power supply voltage 3.3V, the test is performed under the worst condition of the power supply voltage 3.8V. In this case, the peak current noise is greater than when the power supply voltage is 3.3V.

FIG. 1 is a circuit diagram showing a conventional bit line sense amplifier driving circuit.

If a signal sg goes to a logic "high" level, the output of a first NOR gate NO1, i.e. a first node N1, goes to the logic "high" level, thus turning on a second NMOS transistor MN2 and a third PMOS transistor MP3 in a bit line sense amplifier predriver unit 12. Thus, a second node N2 goes to the logic "low" level and a third node N3 goes to the logic "high" level, turning on pull-up and pull-down driver stages MP1 and MN1 in a bit line sense amplifier driver unit 13. Thereby, an rto node N4 becomes a power supply voltage Vcc level and a /s node N5 becomes a ground voltage Vss level. In this case, the second node N2 which controls the operation of the pull-up driver stage MP1 goes from the logic "high" state to the logic "low" state with the turn-on of the second NMOS transistor MN2. The discharging speed to the ground voltage Vss in this case is very slow due to the first and second resistors R1 and R2 series-connected between the second NMOS transistor MN2 and the ground voltage Vss. Thus, the turn-on speed of the pull-up driver stage MP1 becomes slow according to the potential of the second node N2.

FIG. 2 is a graph showing the current flowing to the rto node N4 via the pull-up driver stage MP1. The current has a gentle slope along a time axis, thus to reduce the noise due to the peak current. In the figure, the graph "a" shows the current flowing to the rto node N4 by FIG. 1, the graph "b" shows the current flowing to the rto node N4 at the 4K refresh cycle (Vcc<3.8V) and the graph "c" shows the current flowing to the rto node N4 at the 1K refresh cycle (Vcc≧3.8V).

The rto node N4 which has been changed to the logic "high" state by the pull-up driver stage MP1 supplies a "high" bias voltage to the bit line sense amplifier and thus the bit line sense amplifier senses and amplifies the high data on the bit line.

Similarly, the third node N3 which controls the operation of the pull-down driver stage MN1 goes from the logic "low" state to the logic "high" state with the turn-on of the third PMOS transistor MP3. The charging speed of the third node N3 to the power supply voltage Vcc level is very slow due to the third and fourth resistors R3 and R4 series-connected between the power supply voltage Vcc and the third PMOS transistor MP3. Thus, the turn-on speed of the pull-down driver stage MN1 becomes slow according to the potential of the third node N3. In this case, the current flowing to the /s node N5 via the pull-down driver stage MN1 has a gentle slope along the time axis, thus to reduce the noise due to the peak current. The /s node N5 which has been changed to the logic "low" state by the pull-down driver stage MN1 supplies a "low" bias voltage to the bit line sense amplifier and thus the bit line sense amplifier senses and amplifies the low data on the bit line.

As described above, the bit line sense amplifier can reduce the peak current noise with a gentle slope of sensing, but this deteriorates the sensing speed thereof. Particularly, though the current consumption at the 4K refresh cycle is different from that at the 1K refresh cycle, the current slope is made to be smooth to reduce the peak current noise in accordance with the 1K refresh cycle, causing the loss of the sensing speed at the 4K refresh cycle.

SUMMARY OF THE INVENTION

Accordingly, the present invention is directed to a bit line sense amplifier driving circuit that substantially obviates one or more of the problems due to limitations and disadvantages of the related art.

An object of the present invention is to provide a bit line sense amplifier driving circuit which can reduce the noise due to the sensing peak current and enhance the operating speed by varying the sensing speed at the 1K refresh cycle and at the 4K refresh cycle.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a bit line sense amplifier driving circuit of a semiconductor memory device which has first and second refresh cycle functions includes a bit line sense amplifier driver unit for supplying a pull-up bias potential signal and a pull-down bias potential signal to a bit line sense amplifier; a bit line sense amplifier predriver unit for controlling the current flowing to the bit line sense amplifier driver unit; and a bit line sense amplifier predriver control unit for controlling the bit line sense amplifier predriver unit according to the first and second refresh cycle functions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
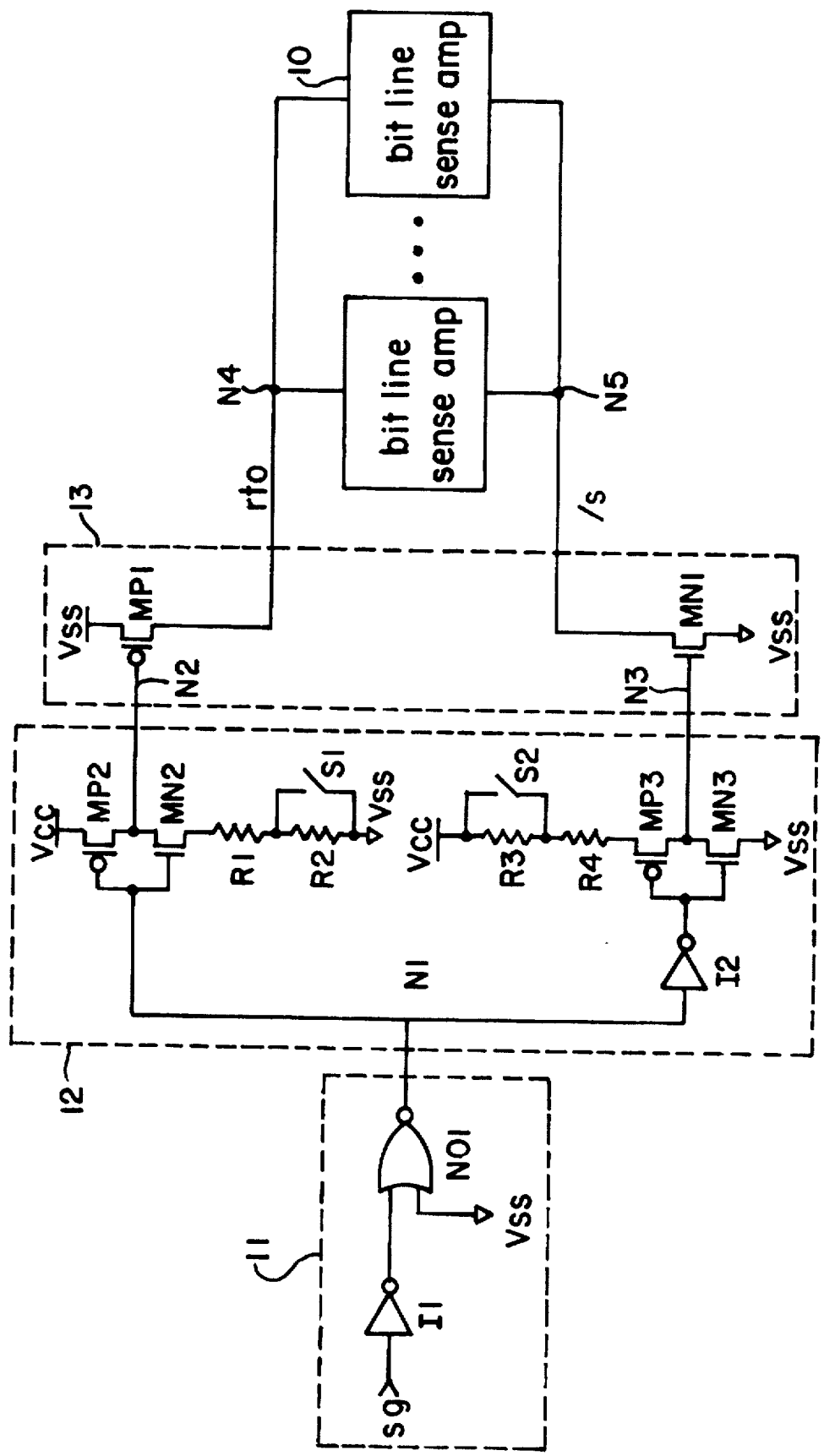
FIG. 1 is a circuit diagram showing a conventional bit line sense amplifier driving circuit.
Figure 2:
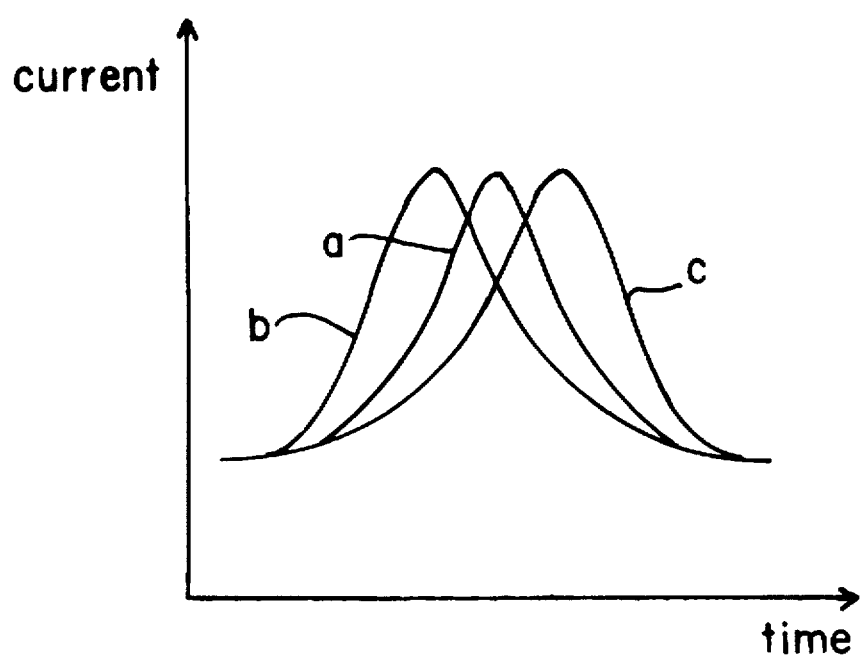
FIG. 2 is a graph showing the current flowing to a pull-up bias potential node via a pull-up driver stage of FIG. 1.
Figure 3:
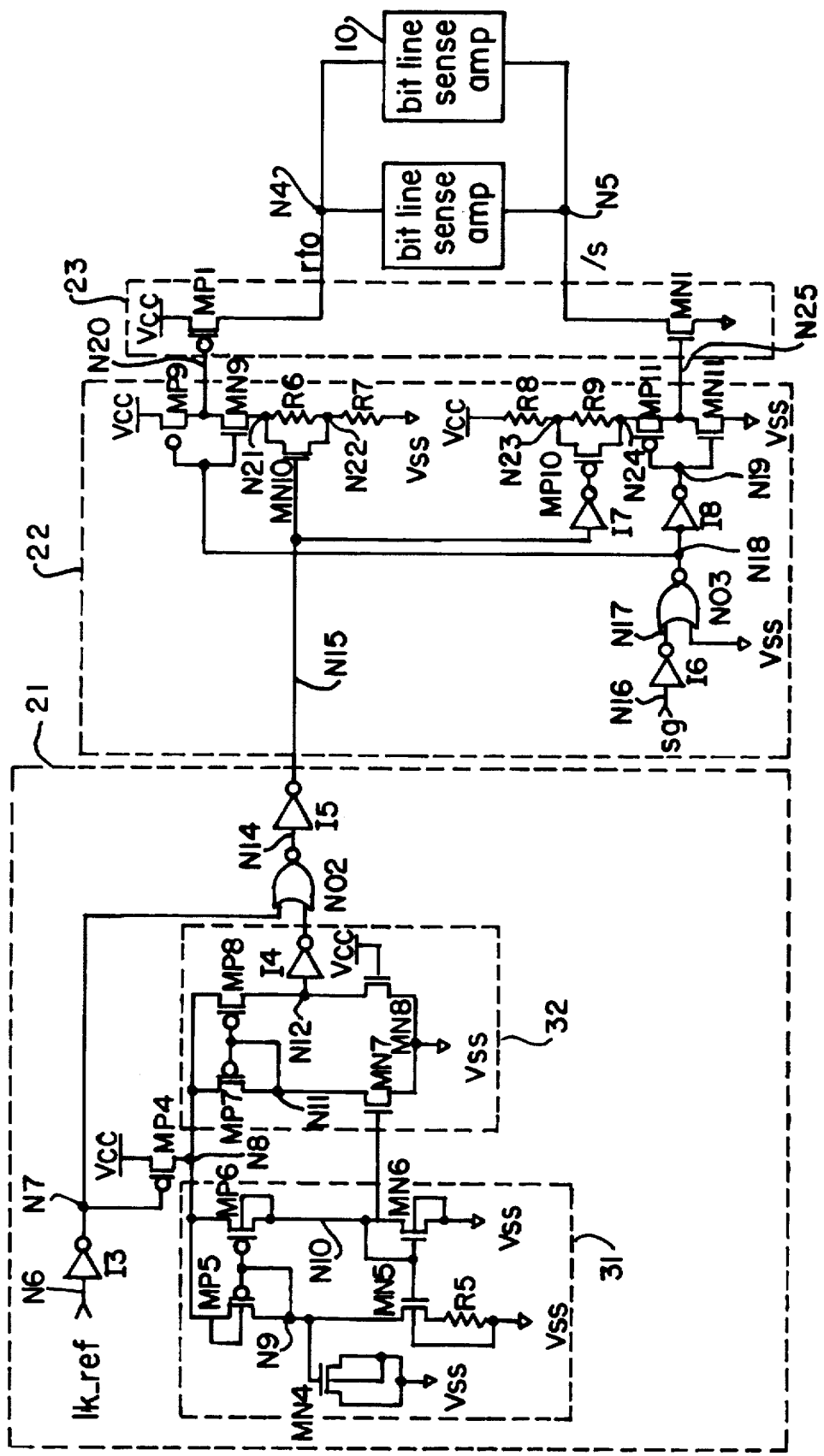
FIG. 3 is a circuit diagram showing a bit line sense amplifier driving circuit according to the present invention.

FIG. 3 is a circuit diagram showing a bit line sense amplifier driving circuit according to the present invention. This circuit has a bit line sense amplifier 10 which inputs a pull-up bias potential signal and a pull-down bias potential signal and senses and amplifies high data and low data; a bit line sense amplifier driver unit 23 for supplying the pull-up bias potential signal and the pull-down bias potential signal to the bit line sense amplifier; a bit line sense amplifier predriver unit 22 for controlling the current of the bit line sense amplifier driver unit 23; and a bit line sense amplifier predriver control unit 21 for controlling the bit line sense amplifier predriver unit 22 to drive variably according to the refresh cycle, i.e. 1K refresh cycle and 4K refresh cycle.

The bit line sense amplifier predriver control unit 21 has a sixth node N6 for inputting a refresh cycle classifying signal which classifies the 1K and 4K refresh cycles; a third inverter I3 connected between the sixth node N6 and a seventh node N7; a fourth PMOS transistor MP4 which is connected between a power supply voltage Vcc and an eighth node N8 and has a gate connected to the seventh node N7; a voltage generator 31 connected between the eighth node N8 and a ground voltage Vss, for generating different logic levels of voltages according to the state of the refresh cycle classifying signal; a differential amplifier 32 connected between the eighth node N8 and the ground voltage Vss, for outputting the logic signal obtained by comparing and amplifying the output voltage of the voltage generator 31 with the power supply voltage Vcc to a thirteenth node N13; a second NOR gate NO2 for NORing the signals at the seventh node N7 and thirteenth node N13 and then outputting to a fourteenth node N14; and a fifth inverter I5 connected between the fourteenth node N14 and a fifteenth node N15.

The voltage generator 31 has fifth and sixth PMOS transistors MP5 and MP6 of current mirror structure which are connected between the eighth node N8 and the ninth and tenth nodes N9 and N10, respectively and have their gates commonly connected to the ninth node N9; fifth and sixth NMOS transistors MN5 and MN6 of current mirror structure which are connected between the ninth and tenth nodes N9 and N10 and the ground voltage Vss, respectively and have their gates commonly connected to the tenth node N10; a resistor R5 connected between the fifth NMOS transistor MN5 and the ground voltage Vss; and a fourth NMOS transistor MN4 diode-connected between the ninth node N9 and the ground voltage Vss.

The differential amplifier 32 has seventh and eighth PMOS transistors MP7 and MP8 of current mirror structure which are connected between the eighth node N8 and the eleventh and twelfth nodes N11 and N12, respectively and have their gates commonly connected to the eleventh node N11; a seventh NMOS transistor MN7 which is connected between the eleventh node N11 and the ground voltage Vss and has a gate connected to the tenth node N10; an eighth NMOS transistor MN8 which is connected between the twelfth node N12 and the ground voltage Vss and has a gate connected to the power supply voltage Vcc; and a fourth inverter I4 connected between the twelfth and thirteenth nodes N12 and N13.

The bit line sense amplifier predriver unit 22 has a sixteenth node N16 for inputting an operation control signal sg; a sixth inverter I6 connected between the sixteenth node N16 and a seventeenth node N17; a third NOR gate NO3 for NORing the voltage at the seventeenth node N17 and the ground voltage Vss and then outputting to an eighteenth node N18; an eighth inverter I8 connected between the eighteenth and nineteenth nodes N18 and N19; a ninth PMOS transistor MP9 which is connected between the power supply voltage Vcc and a twentieth node N20 and has a gate connected to the eighteenth node N18; a ninth NMOS transistor MN9 which is connected between the twentieth node N20 and a twenty-first node N21 and has a gate connected to the eighteenth node N18; a sixth resistor R6 connected between the twenty-first node N21 and a twenty-second node N22; a tenth NMOS transistor MN10 which is connected in parallel to the sixth resistor R6 between the twenty-first and twenty-second nodes N21 and N22 and has a gate connected to the fifteenth node N15; a seventh resistor R7 connected between the twenty-second node N22 and the ground voltage Vss; an eighth resistor R8 connected between the power supply voltage Vcc and a twenty-third node N23; a ninth resistor R9 connected between the twenty-third node N23 and a twenty-fourth node N24; a tenth PMOS transistor MP10 which is connected in parallel to the ninth resistor R9 between the twenty-third node N23 and the twenty-fourth node N24 and has a gate connected to an output terminal of a seventh inverter I7 which inverts the signal on the fifteenth node N15; an eleventh PMOS transistor MP11 which is connected between the twenty-fourth node N24 and a twenty-fifth node N25 and has a gate connected to the nineteenth node N19; and an eleventh NMOS transistor MN11 connected between the twenty-fifth node N25 and the ground voltage Vss and has a gate connected to the nineteenth node N19.

The bit line sense amplifier driver unit 23 has a first PMOS transistor MP1 which is connected between the power supply voltage Vcc and the rto node N4 and has a gate connected to the twentieth node N20; and a first NMOS transistor MN1 which is connected between the /s node N5 and the ground voltage Vss and has a gate connected to the twenty-fifth node N25.

The bit line sense amplifier predriver control unit 21 generates a signal which makes the driving capability of the bit line sense amplifier predriver unit 22 different at the 1K refresh cycle and at the 4K refresh cycle. The signal 1K applied to the sixth node N6 is the refresh cycle classifying signal which has a logic "high" level if the chip operates at the 1K refresh cycle and has a logic "low" level if the chip operates at the 4K refresh cycle. The bit line sense amplifier predriver control unit 21 is comprised of the voltage generator 31 and the differential amplifier 32 of current mirror structure, and the operation thereof is performed only when the refresh cycle classifying signal 1K ref is at the logic "high" level.

The voltage generator 31 generates a comparing voltage of 3.8V to the tenth node N10 at the 1K refresh cycle when the refresh cycle classifying signal 1K ref is at the logic "high" level. Then, the differential amplifier 32 compares this comparing voltage of 3.8V output from the voltage generator 31 with the power supply voltage Vcc. If the power supply voltage Vcc is higher than 3.8V, the twelfth node N12 becomes the logic "low" state, while if the power supply voltage Vcc is lower than 3.8V, the twelfth node N12 becomes the logic "high" state. This is for reducing the noise which may be generated if the power supply voltage Vcc is over 3.8V when testing the chip which has the 1K refresh cycle.

The signal of the twelfth node N12 is then applied to one input of the second NOR gate NO2. Then, the second NOR gate NO2 performs a boolean NOR operation on this signal and the signal of the seventh node N7. The output of the second NOR gate NO2 is inverted by the fifth inverter I5 and is then applied to the bit line sense amplifier predriver unit 22 via the fifteenth node N15.

The bit line sense amplifier predriver unit 22 is for controlling the current flowing into the bit line sense amplifier driver unit 23. The signal at the twentieth node N20 is the signal which transits from the logic "high" level to the logic "low" level, and the signal at the twenty-fifth node N25 is the signal which transits from the logic "low" level to the logic "high" level. The signals at the twentieth and twenty-fifth nodes N20 and N25 operate simultaneously.

The signal at the fifteenth node N15, i.e. the output of the bit line sense amplifier predriver control unit 21 stays at the logic "low" level if the chip operates at the 1K refresh cycle and the power supply voltage Vcc is over 3.8V, while staying at the logic "high" level if the chip operates at the 4K refresh cycle and the power supply voltage Vcc is lower than 3.8V.

If the chip operates at the 1K refresh cycle and the power supply voltage Vcc is over 3.8V, the fifteenth node N15 becomes the logic "low" state, thus turning off the tenth NMOS transistor MN10 and the tenth PMOS transistor MP10. If the chip operates at the 4K refresh cycle and the power supply voltage Vcc is lower than 3.8V, the fifteenth node N15 becomes the logic "high" state, turning on the tenth NMOS transistor MN10 and the tenth PMOS transistor MP10, thus enabling to control the resistors connected to the power supply voltage Vcc and ground voltage Vss.

That is, if the chip operates at the 1K refresh cycle and the power supply voltage Vcc is over 3.8V, the fifteenth node N15 becomes the logic "low" state, thus turning off the tenth NMOS transistor MN10. At this time, with the transition of the enable signal sg applied to the sixteenth node N16 to the logic "high" level, the eighteenth node N18 goes to the logic "high" level, turning on the ninth NMOS transistor MN9. Thereby, the twentieth node N20 transits from the logic "high" state to the logic "low" state. The transition speed of the twentieth node N20 in this case is faster than when the tenth NMOS transistor MN10 is turned on when the chip operates at the 4K refresh cycle and the power supply voltage Vcc is lower than 3.8V. Therefore, the pull-up driver stage MP1 of the bit line sense amplifier driver unit 23 is turned on by the logic "low" signal of the twentieth node N20 and thus supplies the power supply voltage level of pull-up bias signal rto to the fourth node N4.

If the chip operates at the 1K refresh cycle and the power supply voltage Vcc is over 3.8V, the fifteenth node N15 becomes the logic "low" state, thus turning off the tenth PMOS transistor MP10. In this case, the eighteenth node N18 becomes the logic "high" level, as described above, and the nineteenth node N19 goes to the logic "low" level, turning on the eleventh PMOS transistor MP11. Thereby, the twenty-fifth node N25 which controls the operation of the pull-down driver stage MN1 of the bit line sense amplifier driver unit 23 transits from the logic "low" level to the logic "high" level. The transition speed of the twenty-fifth node N25 in this case is faster than when the tenth PMOS transistor MP10 is turned on when the chip operates the 4K refresh cycle and the power supply voltage is lower than 3.8V. Therefore, the pull-down driver stage MN1 of the bit line sense amplifier driver unit 23 is turned on by the logic "high" signal of the twenty-fifth node N25 and thus supplies the ground voltage level of pull-down bias signal /s to the fifth node N5.

That is, the tenth NMOS transistor MN10 and tenth PMOS transistor MP10 of the bit line sense amplifier predriver unit 22 are turned off if the chip operates at the 1K refresh cycle and the power supply voltage Vcc is over 3.8V and turned on in other cases, controlling the current flowing via the resistors connected to the power supply voltage Vcc and ground voltage Vss and thus controlling the transition time of the twentieth and twenty-fifth nodes N20 and N25. The slope of the current which drives the pull-up bias signal rto and the pull-down bias signal /s is determined according to the transition time of the twentieth and twenty-fifth nodes N20 and N25. The pull-up bias signal rto and the pull-down bias signal /s thus generated drive the bit line sense amplifier 10.

Figure 4:
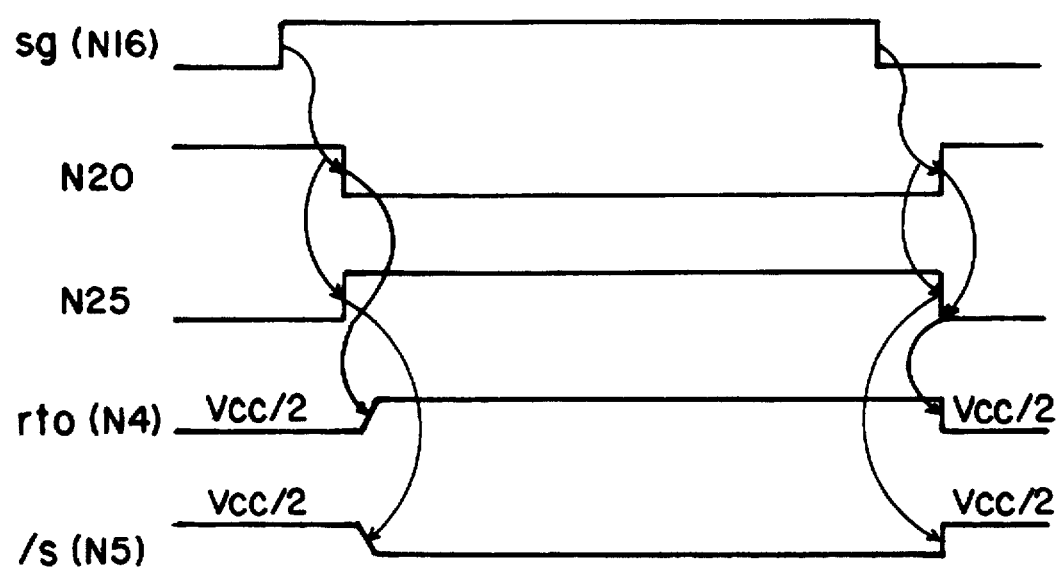
FIG. 4 is a flow chart showing each signal of FIG. 3 according to the present invention.

FIG. 4 is a flow chart showing each signal of FIG. 3 according to the present invention.

With the enable of the control signal sg to the logic "high" level, the signal at the twentieth node N20 which controls the operation of the pull-up driver stage MP1 transits from the logic "high" state to the logic "low" state, and the signal at the twenty-fifth node N25 which controls the operation of the pull-down driver stage MN1 transits from the logic "low" state to the logic "high" state. The transition speed of these signals when the chip operates at the 4K refresh cycle and the power supply voltage Vcc is lower than 3.8V is slower than when the chip operates at the 1K refresh cycle and the power supply voltage Vcc is over 3.8V. Thus, by the transition speed of the twentieth and twenty-fifth nodes N20 and N25, the pull-up bias signal rto transits from the half of the power supply voltage Vcc/2 to the power supply voltage Vcc and the pull-down bias signal /s transits from the half of the power supply voltage Vcc/2 to the ground voltage Vss.

As described above, in the case that the bit line sense amplifier driving circuit is applied to the semiconductor memory device, the peak current noise which may occur when the chip having the 1K refresh cycle is tested at the power supply voltage of 3.8V can be effectively suppressed. In addition, in the chip which has both 1K refresh cycle and 4K refresh cycle, the deterioration of sensing speed at the 4K refresh cycle can be prevented.

It will be apparent to those skilled in the art that various modifications and variations can be made in the bit line sense amplifier driving circuit of the present invention without departing from the spirit or scope of the invention. Thus, it is intended that the present invention cover the modifications and variations of this invention provided they come within the scope of the appended claims and their equivalents.

What is claimed is:

1. A bit line sense amplifier driving circuit of a semiconductor memory device which has first and second refresh cycle functions, comprising:

bit line sense amplifier driver means for supplying a pull-up bias potential signal and a pull-down bias potential signal to a bit line sense amplifier;

bit line sense amplifier predriver means for controlling the current amount of the pull-up bias potential signal and the pull-down bias potential signal of said bit line sense amplifier driver means according to said first and second refresh cycle functions; and bit line sense amplifier predriver control means for controlling said bit line sense amplifier predriver means and generating different logic states according to said first and second refresh cycle functions.

2. The bit line sense amplifier driving circuit as claimed in claim 1, wherein said bit line sense amplifier predriver control means comprise:

an input unit which receives a refresh cycle classifying signal for classifying the first refresh cycle and second refresh cycle;

a voltage generator for outputting a predetermined level of voltage in response to said refresh cycle classifying signal; and a differential amplifier for comparing and amplifying said predetermined level of voltage output from said voltage generator with a power supply voltage.

3. The bit line sense amplifier driving circuit as claimed in claim 2, wherein said input unit is means for inverting said refresh cycle classifying signal, and the output signal of said bit line sense amplifier predriver control means is obtained by NORing an inverted signal of the output of said differential amplifier and the output of said input unit.

4. The bit line sense amplifier driving circuit as claimed in claim 3, wherein said bit line sense amplifier predriver control means output a first logic level under said first refresh cycle function, and output a second logic level under said second refresh cycle function.

5. The bit line sense amplifier driving circuit as claimed in claim 4, wherein said first refresh cycle is a 1K refresh cycle, said second refresh cycle is a 4k refresh cycle, said first logic level is a logic "low" level and said second logic level is a logic "high" level.

6. The bit line sense amplifier driving circuit as claimed in claim 1, wherein said bit line sense amplifier predriver means comprise first inverter means, first resistor means connected in series to said first inverter means, second inverter means and second resistor means connected in series to said second inverter means, both ends of said first resistor means being connected in parallel to a first transistor, both ends of said second resistor means being connected in parallel to a second transistor, whereby said first and second transistors are controlled by the output signal of said bit line sense amplifier predriver control means.

7. The bit line sense amplifier driving circuit as claimed in claim 6, wherein the input signals of said first and second inverter means are predetermined signals corresponding to the output signal of said bit line sense amplifier predriver control means.

8. The bit line sense amplifier driving circuit as claimed in claim 7, wherein said first inverter means is connected between the power supply voltage and one end of said first resistor means the other end of which is connected to the ground voltage, and said second inverter means is connected between said ground voltage and one end of said second resistor means the other end of which is connected to said power supply voltage.

9. The bit line sense amplifier driving circuit as claimed in claim 8, wherein said first and second inverter means are CMOS inverters, said first transistor is an NMOS transistor and said second transistor is a PMOS transistor.

10. The bit line sense amplifier driving circuit as claimed in claim 5, wherein said bit line sense amplifier predriver means comprise first inverter means, first resistor means connected in series to said first inverter means, second inverter means and second resistor means connected in series to said second inverter means, both ends of said first resistor means being connected in parallel to a first transistor, both ends of said second resistor means being connected in parallel to a second transistor, whereby said first and second transistors are controlled by the output signal of said bit line sense amplifier predriver control means.

* * * * *